(12) United States Patent
Gamal El Din et al.

(10) Patent No.: US 10,033,349 B2
(45) Date of Patent: Jul. 24, 2018

(54) LOW LOSS MULTI-STATE PHASE SHIFTER

(71) Applicant: pSemi Corporation, San Diego, CA (US)

(72) Inventors: Mohamed Gamal El Din, Kamp-Lintfort (DE); Uwe Stehr, Ilmenau (DE)

(73) Assignee: pSemi Corporation, San Diego, CA (US)

( * ) Notice: Subject to any disclaimer, the term of this patent is extended or adjusted under 35 U.S.C. 154(b) by 107 days.

(21) Appl. No.: 15/017,433

(22) Filed: Feb. 5, 2016

(65) Prior Publication Data

US 2017/0230028 A1   Aug. 10, 2017

(51) Int. Cl.
*H01P 1/10* (2006.01)
*H03H 7/20* (2006.01)

(52) U.S. Cl.
CPC ..................................... *H03H 7/20* (2013.01)

(58) Field of Classification Search
CPC ..................................... H03H 7/20; H01P 1/18
USPC .................................. 333/101, 139, 156, 164
See application file for complete search history.

(56) References Cited

U.S. PATENT DOCUMENTS

| | | | | |
|---|---|---|---|---|
| 5,424,696 A * | 6/1995 | Nakahara | ................ | H01P 1/185 333/156 |
| 5,519,349 A * | 5/1996 | Nakahara | ................ | H03H 11/20 327/232 |
| 6,281,838 B1 * | 8/2001 | Hong | ................ | H01Q 3/36 333/139 |
| 6,320,481 B1 * | 11/2001 | Sharma | ................ | H01P 1/18 333/159 |
| 7,053,732 B2 * | 5/2006 | Zhou | ................ | H03H 17/0009 333/156 |
| 7,355,492 B2 * | 4/2008 | Hyman | ................ | H01P 1/18 333/139 |
| 7,764,142 B2 * | 7/2010 | Miya | ................ | H03H 11/16 333/139 |

\* cited by examiner

*Primary Examiner* — Dean Takaoka
(74) *Attorney, Agent, or Firm* — Jaquez Land Greenhaus LLP; Martin J. Jaquez, Esq.; John Land, Esq.

(57) ABSTRACT

A multi-state phase shifter circuit having both low insertion loss (IL) and good return loss. Two or more phase shift elements are combined into a single cell architecture to reduce the number of series-connected FET switches and reduce the total IL. One embodiment has two ports connected by parallel signal paths each comprising a pair of switches and a phase shift element comprising, for example, an inductor, a capacitor, a transmission line, or a conductor. Another embodiment has two ports connected by parallel signal paths each comprising a switch and at least one associated phase shift element. The switches in each parallel signal path allow the associated phase shift element to be placed in-circuit under the control of an applied signal. The sets of switches may be independently controlled, so that multiple parallel signal paths may be switched into circuit between the phase shifter circuit ports at the same time.

34 Claims, 3 Drawing Sheets

LOW LOSS MULTI-STATE PHASE SHIFTER

BACKGROUND

(1) Technical Field

This invention relates to electronic radio frequency (RF) circuits, and more particularly to programmable multi-state RF phase shifter circuits.

(2) Background

Electronic phase shifter circuits are used to change the transmission phase angle of a signal, and are commonly used to phase shift radio frequency (RF) signals. It is often necessary to change the phase of RF signals for applications such as in-phase discriminators, beam forming networks, power dividers, linearization of power amplifiers, and phased array antennas, to name a few. Modern phase shifter circuits may be digitally controlled and thus provide a discrete set of phase states that are selected by a digital control word.

FIG. 1 is a block diagram of a conventional 3-bit (8 state) binary-weighted, series connected phase shifter 100. The illustrated phase shifter 100 includes three series-connected phase shift cells 102-1 to 102-3, each including a respective inductor L1-L3 and capacitor C1-C3, and respective pairs of single-pole, double-throw (SPDT) switches S1a-S1b, S2a-S2b, S3a-S3b (generically, Sna).

The switch pairs Sna-Snb in each phase shift cell 102-1 to 102-3 provide input/output symmetry and are concurrently switched to define mutually exclusive signal paths that allow either the associated inductor L1-L3 or the associated capacitor C1-C3 (but not both at the same time) to be placed in-circuit in response to an applied signal from a control circuit (not shown, but conventional). The switches Sna are typically implemented with field effect transistors (FETs), particularly MOSFETs. Because of the SPDT function of the switches Sna, and since FETs are inherently single-pole, single-throw (SPST) devices, typically at least two FETs (or FET stacks, as discussed below) are required to implement each switch Sna. Accordingly, for the phase shifter 100 of FIG. 1, at least 12 FETs are required (although only 6 FETs will be in series between RF1 and RF2 at any particular time).

The values of the inductors L1-L3 and capacitors C1-C3 may be the same but will typically differ somewhat. For example, the three phase shift cells 102-1 to 102-3 may be configured to respectively provide 1.4°, 2.8°, and 1.4° of phase shift (i.e., L1=L3 and C1=C3). For such a configuration, example values for the inductors L1-L3 and capacitors C1-C3 are set forth in TABLE 1.

TABLE 1

| Example Component Values | |
| --- | --- |
| L1, L3 | 0.085 nH |
| C1, C3 | 49.7 pF |
| L2 | 0.17 nH |
| C2 | 24.8 pF |

With three series-connected phase shift cells 102-1 to 102-3, the combinations of inductors and capacitors shown in TABLE 2 can be switched into circuit to shift the phase of an RF signal applied to either port, RF1 or RF2. Accordingly, phase shifter 100 when configured with the values in TABLE 1 can provide phase shifts of 0°, 1.4°, 2.8°, 4.2°, and 5.6° (the number of distinct phase shift states is less than $2^3$ because the phase shift cells 102-1 and 102-3 provide the same amount of phase shift). Note that the illustrated mapping of control bits to in-circuit elements is arbitrary and that other mappings are possible. For example, phase shifter 100 can provide phase shifts of −1.4°, 0°, 1.4°, 2.8°, and 4.2° if State 2 in TABLE 2 is used as the reference state (that is, the phase shift cell 102-3 is set to +1.4° in the reference state); the same result may be achieved by selecting State 5 as the reference state.

TABLE 2

| State | Control Bits | In-Circuit Elements | Phase Shift |
| --- | --- | --- | --- |
| 1 | 000 | C1-C2-C3 | 0° |
| 2 | 001 | C1-C2-L3 | 1.4° |
| 3 | 010 | C1-L2-C3 | 2.8° |
| 4 | 011 | C1-L2-L3 | 4.2° |
| 5 | 100 | L1-C2-C3 | 1.4° |
| 6 | 101 | L1-C2-L3 | 2.8° |
| 7 | 110 | L1-L2-C3 | 4.2° |
| 8 | 111 | L1-L2-L3 | 5.6° |

Series-cell phase shifter architectures suffer from excessive insertion loss (IL) due to the cumulative IL of each switch Sna of the serially-connected phase shifter cells. In the embodiment illustrated in FIG. 1, there are always 6 series switches (FETs) in-circuit in the 3-bit phase shifter 100. The IL problem is exacerbated when additional phase shifter cells are added, since each additional cell adds another pair of series switches (FETs). Further, as the total resistance of the series connected FETs increases, the return loss also becomes worse (i.e., becomes a smaller positive value).

Accordingly, there is a need for a multi-state phase shifter circuit having both low insertion loss and good return loss. The present invention addresses these needs.

SUMMARY OF THE INVENTION

The present invention encompasses a multi-state phase shifter circuit having both low insertion loss (IL) and good return loss. In preferred embodiments, two or more phase shift elements are combined into a single cell architecture to reduce the number of series-connected field effect transistor (FET) switches and thereby reduce the total IL compared to a conventional series-cell phase shifter. Integrated circuit die area can also be reduced because the number of switched elements is reduced.

In one embodiment, a phase shifter circuit has two ports, RF1, RF2 connected by a plurality of n parallel signal paths each comprising a pair of switches Sna and Snb and a phase shift element comprising, for example, one or more inductors Ln, one or more capacitors Cn, or one or more transmission lines. An optional parallel signal path may comprise a THRU conductor situated between corresponding switch pairs Sna-Snb. The switch pairs Sna-Snb in each of the parallel signal paths allow the associated phase shift element or optional conductor to be placed in-circuit under the control of an applied signal. The switches Sna are typically implemented as FETs, particularly MOSFETs. Each of the switches Sna is in a single-pole, single-throw (SPST) configuration, and thus can be implemented with a single FET device. The sets of switch pairs Sna-Snb may be independently controlled, so that two or more parallel signal paths may be switched into circuit between the ports RF1, RF2 at the same time.

In a second embodiment, a phase shifter circuit has two ports, RF1, RF2 connected by a plurality of n parallel signal paths each comprising a switch Sna and at least one associated phase shift element. The phase shift elements may comprise one or more inductors Ln, L'n, one or more capacitors Cn, C'n, or one or more transmission lines, each series connected with a corresponding switch Sna. In each signal path, it would generally be preferred to "split" the phase shift elements, with paired phase shift elements bracketing a switch Sna, so as to provide a "balanced" symmetric circuit with respect to ports RF and RF2. An optional parallel signal path may comprise a THRU conductor in series with a corresponding switch Sna.

The same range of phase shifts can be achieved by embodiments of the present invention as with a conventional series-cell phase shifter circuit, but with a smaller total series FET count. Compared to a conventional phase shifter circuit, an embodiment of the present invention provides essentially the same nominal versus actual phase shift performance while exhibiting significantly better insertion loss and significantly better return loss across a range of RF frequencies. Other advantages of the present invention include fewer FETs or FET stacks, and less extreme component values that are easier to implement in an IC. For example, compared to a conventional series-cell phase shifter with comparable phase shift performance, the present invention requires fewer inductive and capacitive phase shift elements, and may be implemented with larger inductances and smaller capacitances. Larger inductors are less influenced by IC layout parasitic inductances because the parasitic inductances will be less of a percentage of the total inductance. Parasitic capacitance is fairly well controlled in most CMOS technologies, so smaller capacitors translates to less required IC die area. Comparing ratios of total capacitances and total inductances for an example multi-state phase shifter circuit and an example series-cell phase shifter, inductance increases about 250% while capacitance decreases by about 70% with the example embodiment of the present invention. These improved characteristics are significant for RF signal processing devices.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

The present invention encompasses a multi-state phase shifter circuit having low insertion loss (IL) and good return loss. In preferred embodiments, two or more of phase shift elements are combined into a single cell architecture to reduce the number of series-connected field effect transistor (FET) switches and thereby reduce the total IL compared to a conventional series-cell phase shifter. Integrated circuit die area can also be reduced because the number of switched elements is reduced.

Figure 2A:
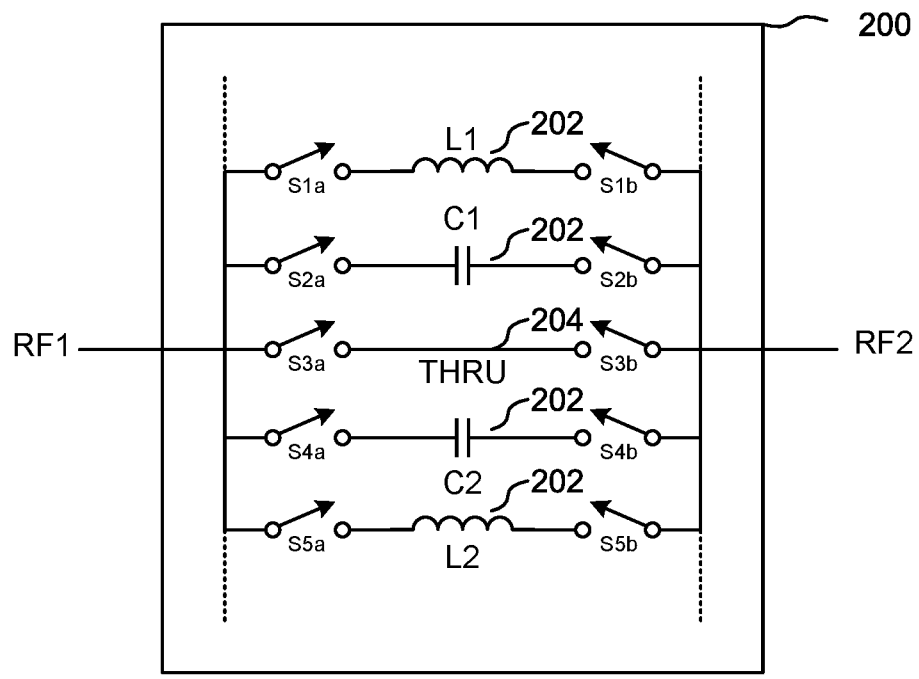
FIG. 2A is a block diagram of a first embodiment of a multi-state phase shifter circuit having low insertion loss and good return loss in accordance with the present invention.

FIG. 2A is a block diagram of a first embodiment of a multi-state phase shifter circuit 200 having low insertion loss and good return loss in accordance with the present invention. The illustrated phase shifter circuit 200 has two ports, RF1, RF2 connected by a plurality of n parallel signal paths each comprising a pair of switches Sna and Snb and an associated phase shift element 202. In the illustrated example, the phase shift elements 202 comprise, for example, one or more inductors Ln, one or more capacitors Cn, or one or more transmission lines, each series connected between corresponding switch pairs Sna-Snb. An optional parallel signal path may comprise a THRU conductor 204 (e.g., a simple wire or IC trace or similar conductor) series connected between corresponding switch pairs Sna-Snb. The illustrated phase shift elements 202 may be physically located on the same integrated circuit (IC) die as the switch pairs Sna-Snb, or an IC may be configured with conductive pads to enable connection of external phase shift elements 202 to the switch pairs Sna-Snb. The relative order of the signal paths is not critical, but a designer may wish to take care to minimize component interactions. In addition, other components (e.g., inductors, capacitors, transmission lines, resistors, switches, etc.) may be added that do not fundamentally change the primary RF circuit impedance but do affect the implementation. As an example, a DC-blocking capacitor may be added to either or both ports RF1, RF2, or added within each series signal path, the capacitance values of such DC-blocking capacitors being sufficiently large that that the added capacitors do not significantly change the desired RF impedance of the phase shifter circuit 200 for a particular application; see also the discussion below regarding FIG. 3.

Components or devices other than those illustrated in FIG. 2 may be used as phase shift elements 202, such as transmission lines (also known as delay lines). For example, all of the phase shift elements 202 may comprise transmission lines of different lengths. This may be especially advantageous if variable true time delay rather than variable phase is desired for a particular application, since phase is proportional to time×frequency. The IL benefit would remain, but the return loss limitation would be eased. Assuming near 50-ohm transmission lines, the impedance mismatch differences between states should be minimal for an embodiment of the invention utilizing transmission lines as phase shift elements 202, and thus not be a constraint as can be the case with individual capacitive or inductive phase shift elements 202. For many broadband applications, true time delay circuits are more ideal than phase shifter circuits; however, phase shifter circuits are typically easier to implement.

The switch pairs Sna-Snb in each of the parallel signal paths provide input/output symmetry and are concurrently switched within a parallel signal path to allow the associated phase shift element 202 or THRU conductor 204 to be placed in-circuit between the ports RF1, RF2 under the control of an applied signal from a control circuit (not shown). The switches Sna are typically implemented as FETs, particularly as MOSFETs. Each of the switches Sna is in a single-pole, single-throw (SPST) configuration, and thus can be implemented with a single FET device (although in order to withstand applied signal voltages in excess of the capabilities of a single FET, stacks of FET switches may be controlled by a common control line signal so as to switch ON or OFF concurrently, and thus behave like a single high-voltage SPST switch). Further, each set of the switch pairs Sna-Snb may be independently controlled, so that two or more parallel signal paths may be switched into circuit between RF1 and RF2 at the same time.

The illustrated multi-state phase shifter circuit 200 shows 5 parallel signal paths, as set forth in TABLE 3. While five parallel signal paths are shown, other embodiments may have more than five parallel signal paths (as suggested by the dotted lines in FIG. 2A). However, the multi-state phase shifter circuit 200 may have as few as three parallel signal paths (e.g., signal path 1, 2 and 3 in TABLE 3) or even as few as two parallel signal paths (if the THRU path 204 is omitted in some embodiments). This latter case differs from the conventional design of FIG. 1, in which the Sna-Snb switches of each phase shift cell 102-$n$ are always concurrently switched, allowing only 2 states: for example, Ln only or Cn only. In contrast, in a two parallel signal path version of the embodiment shown in FIG. 2A, the sets of switch pairs may be independently switched, technically allowing 4 states: for example, no connection ("All-OFF"), L only, C only, and L∥C. The All-OFF state may not function well as a low IL phase shift state, but may be beneficial when total system operation and use cases are considered, such as providing for increased isolation from port RF1 to port RF2 in some applications.

TABLE 3

| Circuit Path | Parallel Signal Path Components | Example Values for Phase Shift Elements |
| --- | --- | --- |
| 1 | S1a-L1-S1b | L1 = 0.376 nH |
| 2 | S2a-C1-S2b | C1 = 15.4 pF |
| 3 | S3a-THRU-S3b | THRU = 0.05 nH |
| 4 | S4a-C2-S4b | C2 = 23 pF |
| 5 | S5a-L2-S5b | L2 = 0.48 nH |

Figure 2B:
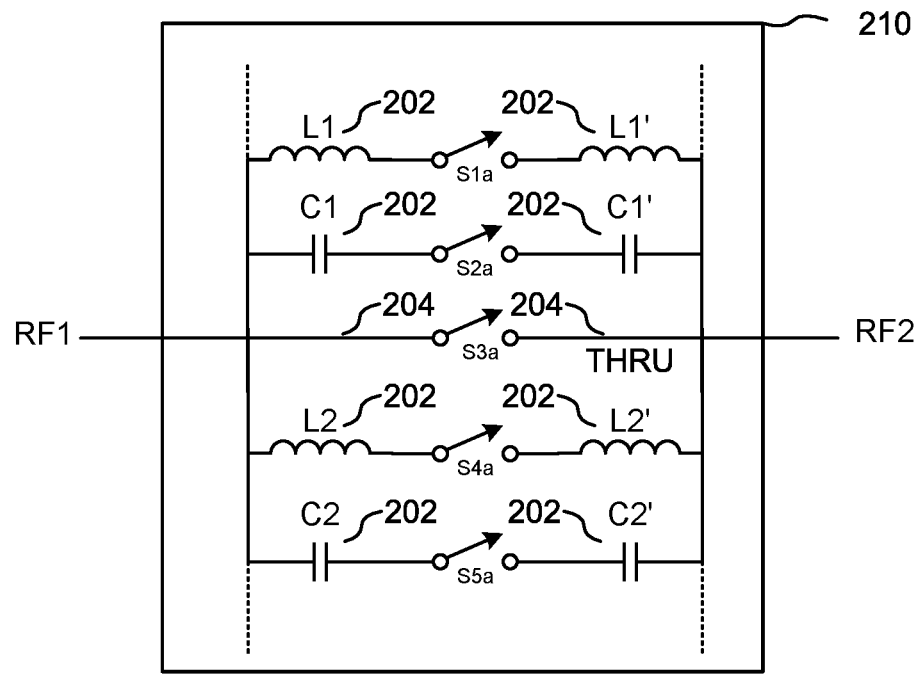
FIG. 2B is a block diagram of a second embodiment of a multi-state phase shifter circuit having low insertion loss and good return loss in accordance with the present invention.

FIG. 2B is a block diagram of a second embodiment of a multi-state phase shifter circuit 210 having low insertion loss and good return loss in accordance with the present invention. In this embodiment, the phase shifter circuit 210 has two ports, RF1, RF2 connected by a plurality of n parallel signal paths each comprising a switch Sna and at least one associated phase shift element 202. In the illustrated example, the phase shift elements 202 comprise, for example, one or more inductors Ln, Ln', one or more capacitors Cn, Cn', or one or more transmission lines series connected with a corresponding switch Sna. An optional parallel signal path may comprise a THRU conductor 204 in series with a corresponding switch Sna.

In each signal path, it would generally be preferred to "split" the phase shift elements 202 as shown—for example, with inductor pairs Ln, Ln' or capacitor pairs Cn, Cn' bracketing a switch Sna—so as to provide a "balanced" symmetric circuit with respect to ports RF1 and RF2. In particular, the parasitics (e.g., capacitance, inductance) of each unused phase shift element 202 are also split between the ports RF1, RF2 so as to provide similar impacts to return loss on both ports. Again, the order of the signal paths is not critical, but a designer may wish to take care to minimize component interactions. As with the embodiment of FIG. 2A, other components or devices may be used as phase shift elements 202, and other components (e.g., inductors, capacitors, transmission lines, resistors, switches, etc.) may be added that do not fundamentally change the primary RF circuit impedance but do affect the implementation. The multi-state phase shifter circuit 210 also may have as few as three parallel signal paths, or as few as two parallel signal paths if the THRU path 204 is omitted in some embodiments.

Figure 3:
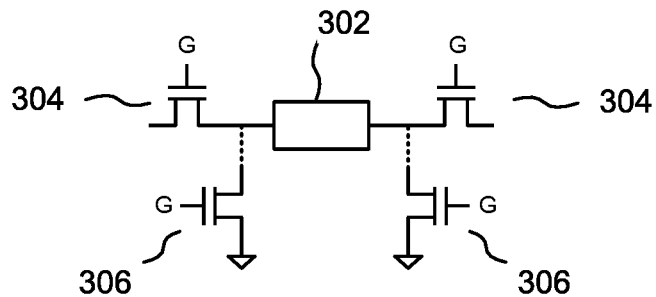
FIG. 3 is a block diagram of a selectable parallel signal path of the type used in FIG. 2A, showing a phase shift element series-connected between two series FET switches.

FIG. 3 is a block diagram of a selectable parallel signal path 300 of the type used in FIG. 2A, showing a phase shift element 302 series-connected between two bracketing series FET switches 304. As with FIG. 2A, the phase shift element 302 may be any of an inductor, a capacitor, a transmission line, or any other active or passive circuit component that affects phase shift (or time delay, for particular applications). Optional shunt FETs 306 coupled to opposite ends of the phase shift element 302 and to circuit ground are switched to a conductive (ON) state to connect the phase shift element 302 to circuit ground when the series FET switches 304 are switched to a non-conductive (OFF) state (thus isolating the phase shift element 302), and are switched to a non-conductive (OFF) state when the series FET switches 304 are switched to a conductive (ON) state. The optional shunt FETs 306 provide improved isolation for the phase shift element 302 (particularly inductor Ln or capacitor Cn phase shift elements 302) with respect to other circuit components. While two optional shunt FETs 306 are shown, a single shunt element 306 would work in most cases since the phase shift element 302 is typically a low impedance device. Likewise, since other parallel phase shift elements 202 (see FIG. 2) that are switched into circuit are low impedance in most cases, the shunt FETs 306 will often not be beneficial and not be needed. A similar circuit may be used for selectively coupling a THRU conductor 204 to ports RF1, RF2 (see FIG. 2 and FIG. 3).

As with the optional shunt FETs 306, only one series FET switch 304 is required and could be used if the non-symmetric nature of such a circuit is deemed acceptable. The reasoning is that the high OFF impedance of a single series FET switch 304, added to a low series impedance, is still a high OFF impedance. See also the discussion above regarding the multi-state phase shifter circuit 210 of FIG. 2.

Each FET 304, 306 in FIG. 3 includes conventional drain and source nodes, as well as a control gate G coupled to control circuitry (not shown) for switching the associated FET to an ON state or an OFF state. The sizes of the various FETs 304, 306 need not be the same. Different FET sizes may be beneficial (in particular and more often, the shunt FETs 306) to provide a more uniform impedance level at each port RF1, RF2 if the bracketed phase shift element 302 is not symmetrical. For example, if the phase shift element 302 includes a spiral inductor, the equivalent model for the element is typically a Pi-type configuration with the spiral inductor in series with a resistor (i.e., the resistance of the inductor and connectors), bracketed by two shunt elements comprising parasitic capacitances. The parasitic capacitances are commonly not of the same value due to the asymmetry of the spiral layout. Accordingly, it may be useful to have FETs 304, 306 sized to offset such asymmetry and provide a more uniform signal path impedance level.

A set of control inputs (3 bits, in the illustrated case) may be mapped to the control gates of the switches of the five parallel signal paths in FIG. 2A or FIG. 2B to connect one or more of the signal paths into series connection between ports RF1 and RF2. Notably, to place any one phase shift element in-circuit, only one set of associated series switch pairs, Sna and Snb, will be active and in series between ports RF1 and RF2, while to place any two phase shift elements in-circuit, only two sets of associated series switch pairs will be active and in series between ports RF1 and RF2—but the two sets of series switch pairs will be in parallel with each other. Thus, the insertion loss (IL) in the first case is the IL through only one series pair of FETs, while the IL in the second case is the IL through two series pairs of FETs in parallel with each other. Hence, the IL of the second case will be smaller since the total effective series resistance through the parallel components is less.

In one particularly useful embodiment, the values of the phase shift elements are selected so that individual impedances are added to a reference impedance, thereby moving the total impedance from a positive/inductive characteristic to negative/capacitive characteristic. For instance, using the example values in TABLE 3 for the phase shift elements in FIG. 2A, and appropriately mapping control signals to the control gates of the associated FET switches, results in the phase shift states shown in TABLE 4.

TABLE 4

| Phase Shift | In-Circuit Phase Shift Elements |
| --- | --- |
| −1.4° | L1 |
| 0° | L1∥L2 |
| 1.4° | THRU line |
| 2.8° | C1∥C2 |
| 4.2° | C1 |

As TABLE 4 makes clear, more than one parallel signal paths may be switched into circuit between the RF1 and RF2 ports at any one time. Thus, referring to TABLE 3 and TABLE 4, parallel signal paths 1 (L1) and 5 (L2) are concurrently switched into circuit for a phase shift of 0°, while parallel signal paths 2 (C1) and 4 (C2) are concurrently switched into circuit for a phase shift of 2.8°.

Embodiments of the present invention are particularly useful in applications requiring only relatively small phase shifts, in order to avoid degradation of voltage standing wave ratio (VSWR) performance. A practical limit for a phase shifter utilizing the present invention may be considered to be an acceptable level of return loss, such as 12 dB or better ("better" meaning more positive values), where return loss=10*log(Pin/Pr) with Pin=power input and Pr=power reflected. However, the concepts apply to applications in which a higher degradation of VSWR and return loss is acceptable. Using a return loss of 12 dB as a minimum standard, a maximum phase shift step size of about 6.5° has been demonstrated in a modelled embodiment of the invention, a significant increase. For a maximum phase shift step size of 4.2°, a return loss of better than 24 dB has been demonstrated in another modeled embodiment of the invention (see TABLE 6b below).

Figure 4:
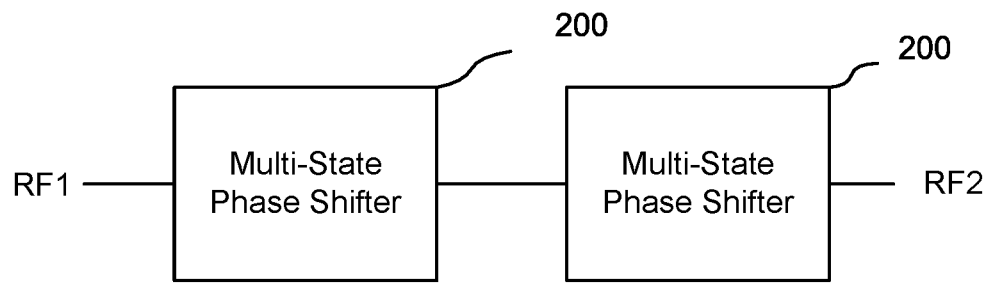
FIG. 4 is a block diagram showing two multi-state phase shifters in accordance with the present invention series coupled in series.
Figure 5:
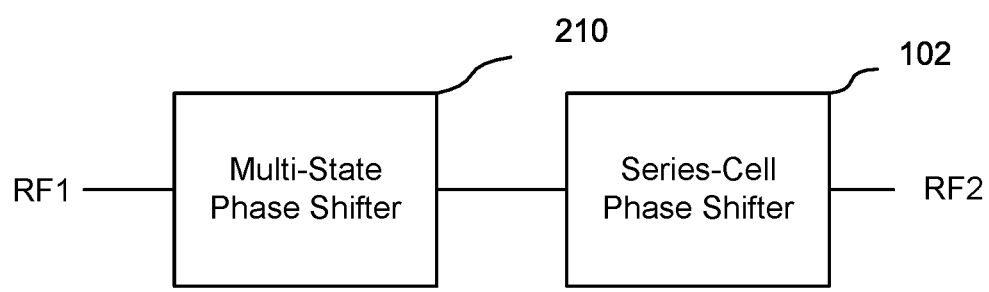
FIG. 5 is a block diagram showing a multi-state phase shifter in accordance with the present invention series coupled to a conventional series-cell phase shifter of the type shown in FIG. 1.

One or more of the multi-state phase shifters 200 of FIG. 2A or the multi-state phase shifters 210 of FIG. 2B may be used as a stand-alone phase shifting component in a larger circuit, or may be combined with other multi-state phase shifters and/or conventional series-cell phase shifters to provide a wider degree of selectable phase shifts. For example, FIG. 4 is a block diagram showing two multi-state phase shifters 200 in accordance with the present invention series coupled in series. As another example, FIG. 5 is a block diagram showing a multi-state phase shifter 210 in accordance with the present invention series coupled to a conventional series-cell phase shifter 102 of the type shown in FIG. 1. Such a configuration may be useful, for example, where a particular application requires a larger degree of phase shift than can be provided by a multi-state phase shifter 210 alone. Other combinations of the multi-state phase shifters 200, 210 of this description or variants may be readily made to meet the requirements of particular applications.

Accordingly, the invention is broadly understood to encompass a multi-state phase shifter having two or more independently selectable parallel impedances that each provide a corresponding amount of phase shift while maintaining an acceptable return loss for all usable phase shift states. In addition, an All-OFF state may have value for uses such as isolation.

Comparison of Designs

Figure 1:
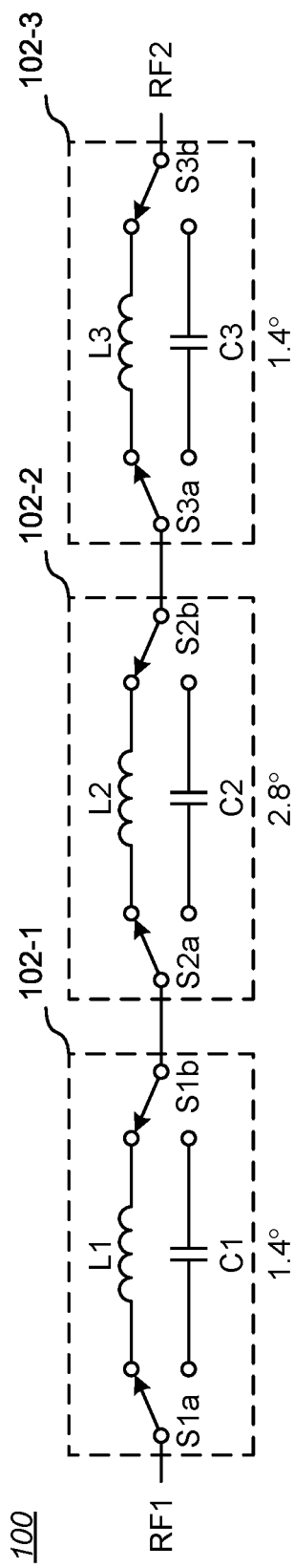
FIG. 1 is a block diagram of a conventional 3-bit (8 state) binary-weighted, series connected phase shifter.

As can be seen from TABLE 4 above, essentially the same range of phase shifts can be achieved by embodiments of the present invention as with a conventional series-cell phase shifter circuit of the type shown in FIG. 1, but with a total series FET count of 2 rather than of 6. Accordingly, IL will be better for the present invention, as well as return loss.

More particularly, the following sets of tables show computed values for insertion loss, return loss, and nominal versus actual phase shift for a modeled version of the conventional series-cell phase shifter 100 of FIG. 1 (TABLES 5a, 6a, 7a) compared to a modeled version of one embodiment of the multi-state phase shifter 200 of FIG. 2A (TABLES 5b, 6b, 7b). The component values in TABLE 1 were used in the model for the conventional series-cell phase shifter 100, while the component values in TABLE 3 were used in the model for the multi-state phase shifter 200. The data illustrates that an embodiment of the present invention compared to a conventional design provides essentially the same nominal versus actual phase shift performance (TABLES 7a, 7b) while exhibiting significantly better insertion loss (TABLES 5a, 5b) and significantly better return loss (TABLES 6a, 6b) across a range of RF frequencies.

TABLE 5A

| | Conventional Design Insertion Loss (dB) at Nominal Phase Shift | | | | |
| --- | --- | --- | --- | --- | --- |
| Freq (GHz) | −1.4° | 0° | 1.4° | 2.8° | 4.2° |
| 2.2 | 0.51 | 0.51 | 0.51 | 0.51 | 0.52 |
| 2.3 | 0.52 | 0.51 | 0.51 | 0.51 | 0.52 |
| 2.4 | 0.52 | 0.51 | 0.51 | 0.51 | 0.52 |
| 2.5 | 0.52 | 0.51 | 0.51 | 0.51 | 0.52 |
| 2.6 | 0.52 | 0.51 | 0.51 | 0.51 | 0.52 |
| 2.7 | 0.52 | 0.51 | 0.51 | 0.51 | 0.51 |

TABLE 5b

| | Example of Invention Insertion Loss (dB) at Nominal Phase Shift | | | | |
| --- | --- | --- | --- | --- | --- |
| Freq (GHz) | −1.4° | 0° | 1.4° | 2.8° | 4.2° |
| 2.2 | 0.18 | 0.09 | 0.17 | 0.09 | 0.18 |
| 2.3 | 0.18 | 0.09 | 0.17 | 0.09 | 0.18 |
| 2.4 | 0.19 | 0.09 | 0.17 | 0.09 | 0.18 |
| 2.5 | 0.19 | 0.09 | 0.17 | 0.09 | 0.18 |
| 2.6 | 0.19 | 0.09 | 0.17 | 0.09 | 0.18 |
| 2.7 | 0.19 | 0.09 | 0.17 | 0.09 | 0.18 |

TABLE 6A

| | Conventional Design Return Loss (dB) at Nominal Phase Shift | | | | |
|---|---|---|---|---|---|
| Freq (GHz) | −1.4° | 0° | 1.4° | 2.8° | 4.2° |
| 2.2 | 22.87 | 24.46 | 24.90 | 23.86 | 22.07 |
| 2.3 | 22.72 | 24.35 | 24.93 | 24.00 | 22.25 |
| 2.4 | 22.57 | 24.25 | 24.94 | 24.13 | 22.42 |
| 2.5 | 22.42 | 24.13 | 24.94 | 24.24 | 22.57 |
| 2.6 | 22.27 | 24.02 | 24.93 | 24.34 | 22.71 |
| 2.7 | 22.11 | 23.90 | 24.91 | 24.43 | 22.84 |

TABLE 6b

| | Example of Invention Return Loss (dB) at Nominal Phase Shift | | | | |
|---|---|---|---|---|---|
| Freq (GHz) | −1.4° | 0° | 1.4° | 2.8° | 4.2° |
| 2.2 | 25.3 | 30.3 | 33.7 | 33.4 | 26.0 |
| 2.3 | 24.9 | 29.9 | 33.6 | 33.7 | 26.3 |
| 2.4 | 24.6 | 29.6 | 33.6 | 34.0 | 26.6 |
| 2.5 | 24.3 | 29.3 | 33.5 | 34.2 | 26.9 |
| 2.6 | 24.0 | 29.0 | 33.5 | 34.5 | 27.2 |
| 2.7 | 23.7 | 28.7 | 33.4 | 34.7 | 27.5 |

TABLE 7a

| | Conventional Design Nominal vs. Actual Phase Shift (degrees) | | | | |
|---|---|---|---|---|---|
| Freq (GHz) | −1.4° | 0° | 1.4° | 2.8° | 4.2° |
| 2.2 | −1.42 | 0.00 | 1.42 | 2.85 | 4.27 |
| 2.3 | −1.42 | 0.00 | 1.42 | 2.84 | 4.25 |
| 2.4 | −1.42 | 0.00 | 1.41 | 2.83 | 4.25 |
| 2.5 | −1.42 | 0.00 | 1.41 | 2.83 | 4.25 |
| 2.6 | −1.42 | 0.00 | 1.42 | 2.83 | 4.25 |
| 2.7 | −1.42 | 0.00 | 1.42 | 2.84 | 4.26 |

TABLE 7b

| | Example of Invention Nominal vs. Actual Phase Shift (degrees) | | | | |
|---|---|---|---|---|---|
| Freq (GHz) | −1.4° | 0° | 1.4° | 2.8° | 4.2° |
| 2.2 | −1.26 | 0.00 | 1.27 | 2.73 | 4.30 |
| 2.3 | −1.32 | 0.00 | 1.33 | 2.76 | 4.26 |
| 2.4 | −1.38 | 0.00 | 1.38 | 2.79 | 4.23 |
| 2.5 | −1.44 | 0.00 | 1.44 | 2.83 | 4.20 |
| 2.6 | −1.50 | 0.00 | 1.50 | 2.87 | 4.19 |
| 2.7 | −1.55 | 0.00 | 1.55 | 2.91 | 4.18 |

The present invention requires less extreme component values that are easier to implement in an IC. For example, TABLE 8 is a comparison of the phase shifter component values (from TABLE 1 and TABLE 3) and the quantities of such components for the conventional series-cell phase shifter 100 of FIG. 1 versus one embodiment of the multi-state phase shifter 200 of FIG. 2A.

TABLE 8

| | Conventional Design | | Example of Invention | |
|---|---|---|---|---|
| Component | Value | Qty | Value | Qty |
| L1 | 0.085 nH | 2 | 0.376 nH | 1 |
| L2 | 0.17 nH | 1 | 0.48 nH | 1 |
| C1 | 49.7 pF | 2 | 15.4 pF | 1 |
| C2 | 24.8 pF | 1 | 23.0 pF | 1 |
| Total L & C | 0.34 nH | 124.2 pF | 0.856 nH | 38.4 pF |
| Series FETs | 6 | | 2 | |

Comparing ratios of total capacitances and total inductances for the example multi-state phase shifter circuit 200 and the series-cell phase shifter 100, inductance increases about 250% while capacitance decreases by about 70% with the illustrated embodiment of the present invention. These improved characteristics are significant for RF signal processing devices.

Advantages of the present invention include fewer FETs or FET stacks (10 for the multi-state phase shifter circuit 200 of FIG. 2A, versus 12 for the series-cell phase shifter 100 of FIG. 1) and fewer inductive and capacitive phase shift elements (4 versus 6), and thus a smaller IC die size. Other advantages include larger inductances (which are easier to implement with precision values on an IC), and smaller capacitances (which are also easier to implement with precision values on an IC, and have less effect on other components). Larger inductors are less influenced by IC layout parasitic inductances because the parasitic inductances will be less of a percentage of the total inductance. Parasitic capacitance is fairly well controlled in most CMOS technologies, so smaller capacitors translates to less required IC die area.

Methods

Another aspect of the invention includes a method for selectively shifting the phase of a radio frequency signal, including:

providing a first port and a second port;
connecting at least two parallel phase shifting signal paths between the first port and the second port, each parallel phase shifting signal path comprising a pair of switches and an associated phase shift element series-connected between the pair of switches; and
operating the pair of switches of each signal path independently of the pair of switches of each other signal path.

Yet another aspect of the invention includes a method for selectively shifting the phase of a radio frequency signal, including:

providing a first port and a second port;
connecting at least two parallel phase shifting signal paths between the first port and the second port, each parallel phase shifting signal path comprising a pair of switches and an associated phase shift element series-connected between the pair of switches, each associated phase shift element comprising one of an inductor, a capacitor, a transmission line;
connecting at least one parallel conductor signal path between the first port and the second port, each parallel conductor signal path comprising a pair of switches and an associated conductor series-connected between the pair of switches; and
operating the pair of switches of each signal path independently of the pair of switches of each other signal path.

Another aspect of the invention includes a method for selectively shifting the phase of a radio frequency signal, including:
  providing a first port and a second port;
  connecting at least two parallel phase shifting signal paths between the first port and the second port, each parallel phase shifting signal path comprising at least one switch and at least one associated phase shift element series-connected to such at least one switch; and
  operating each switch of each signal path independently of each switch of each other signal path.

Still another aspect of the invention includes a method for selectively shifting the phase of a radio frequency signal, including:
  providing a first port and a second port;
  connecting at least two parallel phase shifting signal paths between the first port and the second port, each parallel phase shifting signal path comprising at least one switch and at least one associated phase shift element series-connected to such at least one switch, each associated phase shift element comprising one of an inductor, a capacitor, or a transmission line;
  connecting at least one parallel conductor signal path between the first port and the second port, each parallel conductor signal path comprising at least one switch and an associated conductor series-connected to such at least one switch; and
  operating each switch of each signal path independently of each switch of each other signal path.

Other aspects of the above methods include embodying each phase shift element as one of an inductor, a capacitor, or a transmission line; embodying each switch as a field effect transistor; embodying each switch as a stack of field effect transistors having a stack size sufficient to handle a specified voltage of an applied RF signal; switching more than one parallel signal path into series connection between the first port and the second port at the same time; connecting multiple multi-state phase shifter circuits in series; connecting a multi-state phase shifter circuit to at least one series-cell phase shifter circuit; connecting at least one shunt switch between circuit ground and an end of an associated phase shift element and selectively coupling the end of the associated phase shift element to circuit ground; configuring a multi-state phase shifter circuit to have a return loss of better than about 12 dB from at least about 2.2 GHz to about 2.7 GHz; configuring a multi-state phase shifter circuit to have a return loss of better than about 24 dB from at least about 2.2 GHz to about 2.7 GHz; and embodying a multi-state phase shifter circuit in an integrated circuit.

Calibration and Configuration

The control gate of each FET switch in the illustrated examples includes an associated control line (not shown) that enables setting the switch to an ON (or CLOSED) conductive state or to an OFF (or OPEN) non-conductive or blocking state, and thus behaves as a single-pole, single-throw switch (stacks of FET switches may be controlled by a common control line signal so as to switch ON or OFF concurrently, and thus the stack behaves like a single switch). Each control line would be coupled to other circuitry (not shown), which may be internal or external; for example, control signals may be provided to the switch control lines through the well-known interfaces specified by the MIPI (Mobile Industry Processor Interface) Alliance, or through the well-known Serial Peripheral Interface (SPI) bus, or by direct control signal pins, or by any other convenient means. Applied control signals may be directly coupled to associated FET switches, or first be processed through combinatorial logic circuitry or a mapping circuit (e.g., a lookup table) before being coupled to the control gates of associated FET switches.

Each multi-state phase shifter embodiment may be tested and characterized by conventional testing means used for phase shifters, and packaged in a manner suitable for RF circuits, either alone or as part of a larger circuit or system.

Characterization of a multi-state phase shifter may be performed by comparing each phase shift state with a reference state (i.e., the state of the multi-state phase shifter with no intentional phase shift selected). The difference in phase between the two states is the actual amount of phase shift provided by the selected phase shift state. Calibration of a multi-state phase shifter may be performed by mapping one or more phase shift cells to best match a desired phase shift level.

At the time of manufacture or after testing by a manufacturer or user, a particular phase shift state of a multi-state phase shifter may be configured in various ways to set a fixed degree of phase shift, such as by application of one or more mask layers or "blowing" fusible links. More flexibly, the selectable phase shift states of a multi-state phase shifter may be configured under program control in order to dynamically set such states, such as by the use of look-up tables external or internal to an IC that includes the multi-state phase shifter. In the latter case, a lookup table can be prepared—typically as part of the calibration process—with switch control data that maps each desired phase shift state (e.g., a binary number from 0-7) to a physical state of one or more sets of phase shifter cell switches (i.e., ON and OFF FET switch states).

Program control of a multi-state phase shifter state can be based on a user selection or external control signal, directly or indirectly (e.g., a selected frequency band may by mapped to a specific phase shift state), or be automatically set in response to detected states or parameters (e.g., detected signal frequency, signal strength, power consumption, IC device temperature, etc.).

Uses

Multi-state phase shifters are useful in a wide variety of circuits for performing a range of functions, including (but not limited to) impedance matching circuits, power amplifiers (e.g., scalable periphery tunable matching power amplifiers, and Doherty amplifiers), tuning circuits, RF switches, etc. Such functions are particularly useful in such applications as radar systems (including phased array and automotive radar systems) and radio systems. Radio system usage includes (again, without limitation) cellular radio systems (including base stations, relay stations, and hand-held transceivers) that use technologies such as orthogonal frequency-division multiplexing ("ODFM") and variants thereof, quadrature amplitude modulation ("QAM"), Code Division Multiple Access ("CDMA"), Wide Band Code Division Multiple Access ("W-CDMA"), Worldwide Interoperability for Microwave Access ("WIMAX"), Global System for Mobile Communications ("GSM"), Enhanced Data Rates for GSM Evolution (EDGE), Long Term Evolution ("LTE"), as well as other radio communication standards and protocols.

Fabrication Technologies and Options

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology, or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power or high voltage signals during operation due to FET stacking, good linearity, and high frequency operation (in excess of about 10 GHz, and particularly above about 20 GHz). Monolithic IC implementation is particularly useful since parasitic capacitances generally can be kept low by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims.

What is claimed is:

1. A multi-state phase shifter circuit for selectively shifting the phase of a radio frequency signal, including:
    (a) a first port and a second port; and
    (b) at least two parallel phase shifting signal paths connected between the first port and the second port, each parallel phase shifting signal path comprising at least one switch and at least one associated phase shift element series-connected to such at least one switch, each switch of each signal path being operable independently of each switch of each other signal path;
    wherein more than one signal path may be concurrently switched into series connection between the first port and the second port at the same time, and
    wherein selection of a signal path induces a phase shift state for an applied radio frequency signal, and the phase difference between two phase shift states remains approximately constant as a function of frequency and substantially independent of electrical lengths of each signal path.

2. The multi-state phase shifter circuit of claim 1, wherein each phase shift element includes at least one inductor or at least one capacitor.

3. The multi-state phase shifter circuit of claim 1, further including at least one parallel conductor signal path connected between the first port and the second port, each parallel conductor signal path comprising at least one switch and at least one associated conductor series-connected to such at least one switch.

4. A multi-state phase shifter circuit for selectively shifting the phase of a radio frequency signal, including:
    (a) a first port and a second port;
    (b) at least two parallel phase shifting signal paths connected between the first port and the second port, each parallel signal path comprising at least one switch and at least one associated phase shift element series-connected to such at least one switch, each associated phase shift element comprising at least one inductor or at least one capacitor; and
    (c) at least one parallel conductor signal path connected between the first port and the second port, each parallel conductor signal path comprising at least one switch and an associated conductor series-connected to such at least one switch;
    wherein more than one signal path may be concurrently switched into series connection between the first port and the second port at the same time, and
    wherein each switch of each signal path is operable independently of each switch of each other signal path, selection of a signal path induces a phase shift state for an applied radio frequency signal, and the phase difference between two phase shift states remains approximately constant as a function of frequency and substantially independent of electrical lengths of each signal path.

5. A multi-state phase shifter circuit for selectively shifting the phase of a radio frequency signal, including:
    (a) a first port and a second port;
    (b) a first parallel signal path including a first input element series-connected to the first port, a first switch series-connected to the first input element, and a first output element series-connected to the first switch element and to the second port, the first input and first output elements being inductors;
    (c) a second parallel signal path including a second input element series-connected to the first port, a second switch series-connected to the second input element, and a second output element series-connected to the second switch element and to the second port, the second input and second output elements being inductors;
    (d) a third parallel signal path including a third input element series-connected to the first port, a third switch series-connected to the third input element, and a third output element series-connected to the third switch element and to the second port, the third input and third output elements being conductors;

(e) a fourth parallel signal path including a fourth input element series-connected to the first port, a fourth switch series-connected to the fourth input element, and a fourth output element series-connected to the fourth switch element and to the second port, the fourth input and fourth output elements being capacitors; and (f) a fifth parallel signal path including a fifth input element series-connected to the first port, a fifth switch series-connected to the fifth input element, and a fifth output element series-connected to the fifth switch element and to the second port, the fifth input and fifth output elements being capacitors;

wherein the switch of each signal path is operable independently of the switch of each other signal path.

6. The multi-state phase shifter circuit of claim 1, 4, or 5, wherein each switch includes at least one field effect transistor.

7. The multi-state phase shifter circuit of claim 1, 4, or 5, wherein each switch includes a stack of field effect transistors having a stack size sufficient to handle a specified voltage of an applied radio frequency signal.

8. The multi-state phase shifter circuit of claim 5, wherein more than one signal path may be concurrently switched into series connection between the first port and the second port at the same time.

9. The multi-state phase shifter circuit of claim 1, 4, or 5, series-connected to at least one additional multi-state phase shifter circuit.

10. The multi-state phase shifter circuit of claim 1, 4, or 5, series-connected to at least one series-cell phase shifter circuit.

11. The multi-state phase shifter circuit of claim 1, 4, or 5, further including at least one shunt switch coupled between circuit ground and an end of an associated phase shift element.

12. The multi-state phase shifter circuit of claim 1 or 4, wherein each parallel phase shifting signal path includes only one switch.

13. A method for selectively shifting the phase of a radio frequency signal, including:
(a) providing a first port and a second port;
(b) connecting at least two parallel phase shifting signal paths between the first port and the second port, each parallel phase shifting signal path comprising at least one switch and at least one associated phase shift element series-connected to such at least one switch; and
(c) operating each switch of each signal path independently of the switch of each other signal path;
wherein more than one signal path may be concurrently switched into series connection between the first port and the second port at the same time, and
wherein selection of a signal path induces a phase shift state for an applied radio frequency signal, and the phase difference between two phase shift states remains approximately constant as a function of frequency and substantially independent of electrical lengths of each signal path.

14. The method of claim 13, wherein each phase shift element includes at least one inductor or at least one capacitor.

15. The method of claim 13, further including connecting at least one parallel conductor signal path between the first port and the second port, each at least one parallel conductor signal path comprising at least one switch and at least one associated conductor series-connected to such at least one switch.

16. A method for selectively shifting the phase of a radio frequency signal, including:
(a) providing a first port and a second port;
(b) connecting at least two parallel phase shifting signal paths between the first port and the second port, each parallel phase shifting signal path comprising at least one switch and at least one associated phase shift element series-connected to such at least one switch, each associated phase shift element comprising at least one inductor or at least one capacitor;
(c) connecting at least one parallel conductor signal path between the first port and the second port, each parallel conductor signal path comprising at least one switch and an associated conductor series-connected to such at least one switch; and
(d) operating each switch of each signal path independently of each switch of each other signal path
wherein more than one signal path may be concurrently switched into series connection between the first port and the second port at the same time, and
wherein selection of a signal path induces a phase shift state for an applied radio frequency signal, and the phase difference between two phase shift states remains approximately constant as a function of frequency and substantially independent of electrical lengths of each signal path.

17. A method for selectively shifting the phase of a radio frequency signal, including:
(a) providing a first port and a second port;
(b) connecting a first parallel signal path between the first port and the second port, the first parallel signal path including a first input element series-connected to the first port, a first switch series-connected to the first input element, and a first output element series-connected to the first switch element and to the second port, the first input and first output elements being inductors;
(c) connecting a second parallel signal path between the first port and the second port, the second parallel signal path including a second input element series-connected to the first port, a second switch series-connected to the second input element, and a second output element series-connected to the second switch element and to the second port, the second input and second output elements being inductors;
(d) connecting a third parallel signal path between the first port and the second port, the third parallel signal path including a third input element series-connected to the first port, a third switch series-connected to the third input element, and a third output element series-connected to the third switch element and to the second port, the third input and third output elements being conductors;
(e) connecting a fourth parallel signal path between the first port and the second port, the fourth parallel signal path including a fourth input element series-connected to the first port, a fourth switch series-connected to the fourth input element, and a fourth output element series-connected to the fourth switch element and to the second port, the fourth input and fourth output elements being capacitors;
(f) connecting a fifth parallel signal path between the first port and the second port, the fifth parallel signal path including a fifth input element series-connected to the first port, a fifth switch series-connected to the fifth input element, and a fifth output element series-connected to the fifth switch element and to the second port, the fifth input and fifth output elements being capacitors; and (g) operating each switch of each signal path independently of each switch of each other signal path.

18. A multi-state phase shifter circuit for selectively shifting the phase of a radio frequency signal, including:
    (a) a first port and a second port; and
    (b) at least two parallel phase shifting signal paths connected between the first port and the second port, each parallel phase shifting signal path comprising a pair of switches and an associated phase shift element series-connected between the pair of switches, the pair of switches of each signal path being operable independently of the pair of switches of each other signal path;
    wherein more than one signal path may be concurrently switched into series connection between the first port and the second port at the same time, and
    wherein selection of a signal path induces a phase shift state for an applied radio frequency signal, and the phase difference between two phase shift states remains approximately constant as a function of frequency and substantially independent of electrical lengths of each signal path.

19. The multi-state phase shifter circuit of claim 18, wherein each phase shift element includes at least one inductor or at least one capacitor.

20. The multi-state phase shifter circuit of claim 18, further including at least one parallel conductor signal path connected between the first port and the second port, each at least one parallel conductor signal path comprising a pair of switches and an associated conductor series-connected between such pair of switches.

21. A multi-state phase shifter circuit for selectively shifting the phase of a radio frequency signal, including:
    (a) a first port and a second port;
    (b) at least two parallel phase shifting signal paths connected between the first port and the second port, each parallel phase shifting signal path comprising a pair of switches and an associated phase shift element series-connected between the pair of switches, each associated phase shift element comprising at least one inductor or at least one capacitor; and
    (c) at least one parallel conductor signal path connected between the first port and the second port, each parallel conductor signal path comprising at least one switch and an associated conductor series-connected to such at least one switch;
    wherein the pair of switches of each signal path are operable independently of the pair of switches of each other signal path, selection of a signal path induces a phase shift state for an applied radio frequency signal, wherein more than one signal path may be concurrently switched into series connection between the first port and the second port at the same time, and the phase difference between two phase shift states remains approximately constant as a function of frequency and substantially independent of electrical lengths of each signal path.

22. A multi-state phase shifter circuit for selectively shifting the phase of a radio frequency signal, including:
    (a) a first port and a second port;
    (b) a first parallel signal path including a first input switch series-connected to the first port, a first element series-connected to the first input switch, and a first output switch series-connected to the first element and to the second port, the first element being a first inductor;
    (c) a second parallel signal path including a second input switch series-connected to the second port, a second element series-connected to the second input switch, and a second output switch series-connected to the second element and to the second port, the second element being a second inductor;
    (d) a third parallel signal path including a third input switch series-connected to the third port, a third element series-connected to the third input switch, and a third output switch series-connected to the third element and to the second port, the third element being a conductor;
    (e) a fourth parallel signal path including a fourth input switch series-connected to the fourth port, a fourth element series-connected to the fourth input switch, and a fourth output switch series-connected to the fourth element and to the second port, the fourth element being a first capacitor; and
    (f) a fifth parallel signal path including a fifth input switch series-connected to the fifth port, a fifth element series-connected to the fifth input switch, and a fifth output switch series-connected to the fifth element and to the second port, the fifth phase shift element being a second capacitor;
    wherein input and output switches of each signal path are operable independently of the input and output switches of each other signal path.

23. The multi-state phase shifter circuit of claim 18, 21, or 22, wherein each switch includes at least one field effect transistor.

24. The multi-state phase shifter circuit of claim 18, 21, or 22, wherein each switch includes a stack of field effect transistors having a stack size sufficient to handle a specified voltage of an applied radio frequency signal.

25. The multi-state phase shifter circuit of claim 22, wherein more than one signal path may be concurrently switched into series connection between the first port and the second port at the same time.

26. The multi-state phase shifter circuit of claim 18, 21, or 22, series-connected to at least one additional multi-state phase shifter circuit.

27. The multi-state phase shifter circuit of claim 18, 21, or 22, series-connected to at least one series-cell phase shifter circuit.

28. The multi-state phase shifter circuit of claim 18, 21, or 22, further including at least one shunt switch coupled between circuit ground and an end of an associated phase shift element.

29. The multi-state phase shifter circuit of claim 18 or 21, wherein each parallel phase shifting signal path includes only one switch.

30. A method for selectively shifting the phase of a radio frequency signal, including:
    (a) providing a first port and a second port;
    (b) connecting at least two parallel phase shifting signal paths between the first port and the second port, each parallel phase shifting signal path comprising a pair of switches and an associated phase shift element series-connected between the pair of switches; and
    (c) operating the pair of switches of each signal path independently of the pair of switches of each other signal path;
    wherein more than one signal path may be concurrently switched into series connection between the first port and the second port at the same time, and
    wherein selection of a signal path induces a phase shift state for an applied radio frequency signal, and the phase difference between two phase shift states remains approximately constant as a function of frequency and substantially independent of electrical lengths of each signal path.

31. The method of claim 30, wherein each phase shift element includes at least one inductor or at least one capacitor.

32. The method of claim 30, further including connecting at least one parallel conductor signal path between the first port and the second port, each at least one parallel conductor signal path comprising a pair of switches and an associated conductor series-connected between such pair of switches.

33. A method for selectively shifting the phase of a radio frequency signal, including:
 (a) providing a first port and a second port;
 (b) connecting at least two parallel phase shifting signal paths between the first port and the second port, each parallel phase shifting signal path comprising a pair of switches and an associated phase shift element series-connected between the pair of switches, each associated phase shift element comprising at least one inductor or at least one capacitor;
 (c) connecting at least one parallel conductor signal path between the first port and the second port, each parallel conductor signal path comprising at least one switch and an associated conductor series-connected to such at least one switch; and
 (d) operating the pair of switches of each signal path independently of the pair of switches of each other signal path;
 wherein more than one signal path may be concurrently switched into series connection between the first port and the second port at the same time, and
 wherein selection of a signal path induces a phase shift state for an applied radio frequency signal, and the phase difference between two phase shift states remains approximately constant as a function of frequency and substantially independent of electrical lengths of each signal path.

34. A method for selectively shifting the phase of a radio frequency signal, including:
 (a) providing a first port and a second port;
 (b) connecting a first parallel signal path between the first port and the second port, the first parallel signal path including a first input switch series-connected to the first port, a first element series-connected to the first input switch, and a first output switch series-connected to the first element and to the second port, the first element being a first inductor;
 (c) connecting a second parallel signal path between the first port and the second port, the second parallel signal path including a second input switch series-connected to the second port, a second element series-connected to the second input switch, and a second output switch series-connected to the second element and to the second port, the second element being a second inductor;
 (d) connecting a third parallel signal path between the first port and the second port, the third parallel signal path including a third input switch series-connected to the third port, a third element series-connected to the third input switch, and a third output switch series-connected to the third element and to the second port, the third element being a conductor;
 (e) connecting a fourth parallel signal path between the first port and the second port, the fourth parallel signal path including a fourth input switch series-connected to the fourth port, a fourth element series-connected to the fourth input switch, and a fourth output switch series-connected to the fourth element and to the second port, the fourth element being a first capacitor;
 (f) connecting a fifth parallel signal path between the first port and the second port, the fifth parallel signal path including a fifth input switch series-connected to the fifth port, a fifth element series-connected to the fifth input switch, and a fifth output switch series-connected to the fifth element and to the second port, the fifth element being a second capacitor; and
 (g) operating the input and output switches of each signal path independently of the input and output switches of each other signal path.

\* \* \* \* \*